United States Patent
Yahata et al.

(10) Patent No.: US 8,148,736 B2
(45) Date of Patent: Apr. 3, 2012

(54) FLIP CHIP TYPE LIGHT-EMITTING ELEMENT

(75) Inventors: Kosuke Yahata, Aichi-ken (JP); Naoki Nakajo, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 308 days.

(21) Appl. No.: 12/222,366

(22) Filed: Aug. 7, 2008

(65) Prior Publication Data

US 2009/0039374 A1    Feb. 12, 2009

(30) Foreign Application Priority Data

Aug. 8, 2007    (JP) .............................. P. 2007-207258

(51) Int. Cl.
    *H01L 27/15*    (2006.01)
(52) U.S. Cl. ............... 257/81; 257/79; 257/E33.047
(58) Field of Classification Search .............. 257/79, 257/81, 88, 103, E33.023, E33.047, E33.067, 257/E33.069
    See application file for complete search history.

(56) References Cited

U.S. PATENT DOCUMENTS

| | | | |
|---|---|---|---|
| 6,486,499 B1 | 11/2002 | Krames et al. | |
| 6,958,498 B2* | 10/2005 | Shelton et al. | 257/99 |
| 7,183,586 B2* | 2/2007 | Ichihara et al. | 257/98 |
| 7,417,220 B2* | 8/2008 | Suehiro et al. | 250/239 |
| 7,429,750 B2* | 9/2008 | Suehiro et al. | 257/53 |
| 7,429,755 B2* | 9/2008 | Hsu | 257/81 |
| 7,598,531 B2* | 10/2009 | Erchak et al. | 257/91 |
| 7,652,296 B2* | 1/2010 | Chu | 257/79 |
| 2003/0052323 A1* | 3/2003 | Takeuchi et al. | 257/81 |
| 2005/0067624 A1* | 3/2005 | Steigerwald et al. | 257/79 |
| 2006/0001035 A1 | 1/2006 | Suehiro et al. | |
| 2006/0131599 A1* | 6/2006 | Slater et al. | 257/98 |
| 2007/0145381 A1 | 6/2007 | Unno et al. | |
| 2010/0308301 A1 | 12/2010 | Unno et al. | |

FOREIGN PATENT DOCUMENTS

| | | |
|---|---|---|
| JP | 57-40986 (A) | 3/1982 |
| JP | 10-256602 (A) | 9/1998 |
| JP | 11-340514 | 12/1999 |
| JP | 11-340514 (A) | 12/1999 |
| JP | 2001-203386 | 7/2001 |
| JP | 2003-524295 | 8/2003 |
| JP | 2004-56109(A) | 2/2004 |
| JP | 2005-197289 | 7/2005 |
| JP | 2006-12916 (A) | 1/2006 |
| JP | 2007-173530 (A) | 7/2007 |
| WO | 01/41223 A1 | 6/2001 |

OTHER PUBLICATIONS

Notification of Reason for Refusal dated Oct. 20, 2011 (with an English translation).

* cited by examiner

*Primary Examiner* — David Vu

(74) *Attorney, Agent, or Firm* — McGinn IP Law Group, PLLC

(57) ABSTRACT

In a flip chip type light-emitting element of the present invention, an n type contact electrode 14 is formed on an n layer 11 exposed in a comb-tooth shape, a light transmission electrode 15 made of an ITO is formed over the entire surface of an upper surface of a p layer 13 and twenty pad electrodes 16 are formed at prescribed intervals on the light transmission electrode 15. The plane form of the pad electrode 16 has four branches 16*b* protruding in the form of a cross from a circular central part 16*a* and the adjacent pad electrodes 16 connected to each other by the branches 16*b*.

20 Claims, 4 Drawing Sheets

FLIP CHIP TYPE LIGHT-EMITTING ELEMENT

BACKGROUND OF THE INVENTION

1. Field of the Invention

The present invention relates to a flip chip type light-emitting element formed with a III-group nitride semiconductor, and more particularly to a flip chip type light-emitting element having a feature in the form of an electrode.

2. Description of the Related Art

In recent years, various techniques are made use of to suppress unevenness in light transmission by uniformly supplying an electric current to a light-emitting layer in the flip chip type light-emitting element formed with the III-group nitride semiconductor.

For instance, as a technique for improving the diffusion characteristics of a current to a light-emitting layer, a technique that an n layer is exposed in a comb-tooth shape and an n type contact electrode is provided in the exposed part is disclosed in Patent Documents 1 and 2. Further, Patent Documents 2 and 3 disclose a technique that a light transmission electrode is provided on the entire surface of a p layer to diffuse a current to the p layer from a pad electrode by the light transmission electrode. Further, Patent Documents 1 and 3 disclose a technique that a plurality of pad electrodes are provided on a p electrode to improve diffusion characteristics of a current to the p electrode from the pad electrodes.

Further, Patent Document 4 discloses a technique that a metal film is provided in an insulating protective film with which the surface of a III-group nitride semiconductor layer is covered to improve a reflection factor.

Patent Document 1: JP-A-2001-203386
Patent Document 2: JP-A-2003-524295
Patent Document 3: JP-A-2005-197289
Patent Document 4: JP-A-11-340514

However, in the flip chip type light-emitting element having a light transmission electrode on the surface of a p layer and a plurality of pad electrodes provided on the light transmission electrode, a problem arises that since the areas of the pad electrodes are small, an electric current is concentrated on the contact parts of the pad electrodes and the light transmission electrode to deteriorate the light transmission electrode.

SUMMARY OF THE INVENTION

Thus, it is an object of the present invention to realize a flip chip type light-emitting element in which the deterioration of a light transmission electrode is suppressed.

A first invention concerns a flip chip type light-emitting element comprising: a III-group nitride semiconductor layer composed of an n layer, a p layer and an active layer formed between the n layer and the p layer; the n layer being exposed in a comb-tooth shape; an n type contact electrode provided on the n layer; a light transmission electrode provided on the p layer; a plurality of pad electrodes provided on the light transmission electrode; an insulating protective film that covers the surface of the III-group nitride semiconductor layer except a part of the pad electrodes; and a reflecting film provided above the light transmission electrode and in the insulating protective film so as to reflect a light emitted from the active layer to a side of the n layer, and wherein the pad electrode has a base part that is not covered with the insulating protective film and a branch part that is formed in a shape having a convex and a concave and is continued from the base part and is covered with the insulating protective film.

The III-group nitride semiconductor designates materials expressed by a general formula $Al_x Ga_y In_{1-x-y} N (0 \leq x \leq 1, 0 \leq y \leq 1, 0 \leq x+y \leq 1)$ such as GaN, AlGaN, InGaN, AlGaInN, etc. Ordinarily, a main layer is formed with a semiconductor including Ga and N as essential components. As n type impurities, Si or the like is used. As p type impurities, Mg or the like is used. The n layer and the p layer may be composed of single layers or a plurality of layers and include super lattice layers. For instance, the n layer is composed of an n type contact layer and an n type clad layer. The p layer is composed of a P type clad layer and a p type contact layer. The active layer has a structure such as MQW or SQW.

For the light transmission electrode, ITO, ZnO or the like is employed. For the insulating protective film, $SiO_2$ or the like is used. Further, the pad electrode may be made of a multilayer film including a plurality of metal layers. Since Ni has good contact characteristic with the light transmission electrode, Ni or an Ni alloy is desirably employed. For instance, as the pad electrode, Ni/Au/Al or the like is used. The light transmission characteristics described herein mean to transmit a light-transmitting wavelength of the flip chip type light-emitting element. For the reflecting film, a high reflective metal such as Ag or Al can be used.

The III-group nitride semiconductor layer is formed on a grown substrate such as sapphire by an MOCVD method, however, in the flip chip type light-emitting element of the present invention, the grown substrate may be provided or the grown substrate may be removed by a laser lift off method.

As the forms of the branch part of the pad electrode, any of forms having a convex and concave may be used however, forms having a symmetric property such as a linear symmetric property are more easily formed. As the forms having a convex and concave, for instance, forms are exemplified in which linear branch part protrudes in radial directions or in the form of a cross from the base part of the pad electrode. The pad electrodes are respectively connected together by the branch part.

A second invention concerns a flip chip type light-emitting element according to the first invention, characterized in that the branch part is formed in a linear shape protruding from the base part.

A third invention concerns a flip chip type light-emitting element according to the second invention, characterized in that the branch part is formed in a linear shape protruding in the form of a cross from the base part.

A fourth invention concerns a flip chip type light-emitting element according to the second invention, characterized in that the branch part further has a branching linear shape relative to the linear shape.

All of the protruding branch part does not need to further branch. For instance, only the branch part for connecting together the pad electrodes may further have a branching form.

A fifth invention concerns a flip chip type light-emitting element according to any one of the first invention to the fourth invention, characterized in that the branch part is extended in the lower part of the reflecting film.

A sixth invention concerns a flip chip type light-emitting element according to any one of the first invention to the fifth invention, characterized in that the light transmission electrode is composed of an ITO.

During the operation of the flip chip type light-emitting element, an electric current is not dispersed to flow on the entire part of an interface of the pad electrode and the light transmission electrode, but is concentrically supplied to a side part as the outer periphery of the interface. Thus, as in the first invention, the plane form of the pad electrode has a convex and concave shape so that the outer periphery can be lengthened without increasing the area of the interface more than the area of a usual circular pad electrode (that is, without decreasing the light intensity of the light-emitting element), the current can be dispersed and the current density of the side part can be reduced. As a result, the light intensity the same as that of the usual light-emitting element can be maintained and the deterioration of the light transmission electrode can be prevented at the same time. Further, the deterioration of the light transmission electrode is prevented so that the rise of Vf can be suppressed.

As the form is a shape having a convex and a concave, can be used the configuration having the branch part formed in a linear shape protruding from the base part as in the second invention or the configuration having the branch part formed in a linear shape protruding in a cross from the base part as in the third invention. Further, when the branch part further has a branching linear shape as in the fourth invention, the outer periphery is more lengthened, so that the current can be more dispersed.

Further, as in the fifth invention, since the branch part of the pad electrode are covered with the insulating protective film, the reflecting film can be provided to the upper parts of the branch parts of the pad electrode.

Further, as in the sixth invention, the ITO can be used as the light transmission electrode.

DESCRIPTION OF THE PREFERRED EMBODIMENTS

Figure 1:
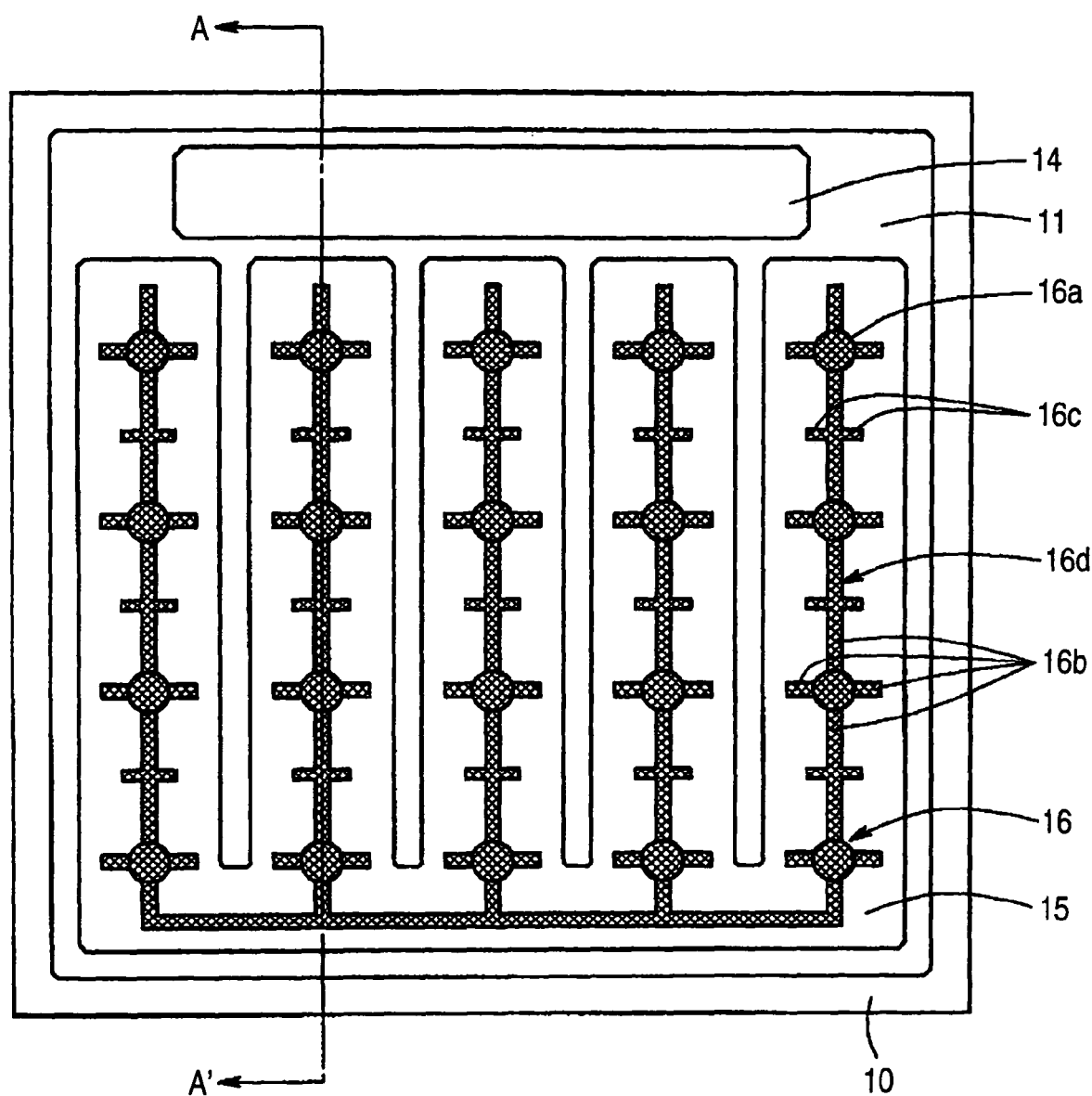
FIG. 1 is a plan view of a flip chip type light-emitting element of a first embodiment.

Now, a specific embodiment of the present invention will be described below by referring to the drawings, however; the present invention is not limited to the embodiment.

First Embodiment

Figure 2:
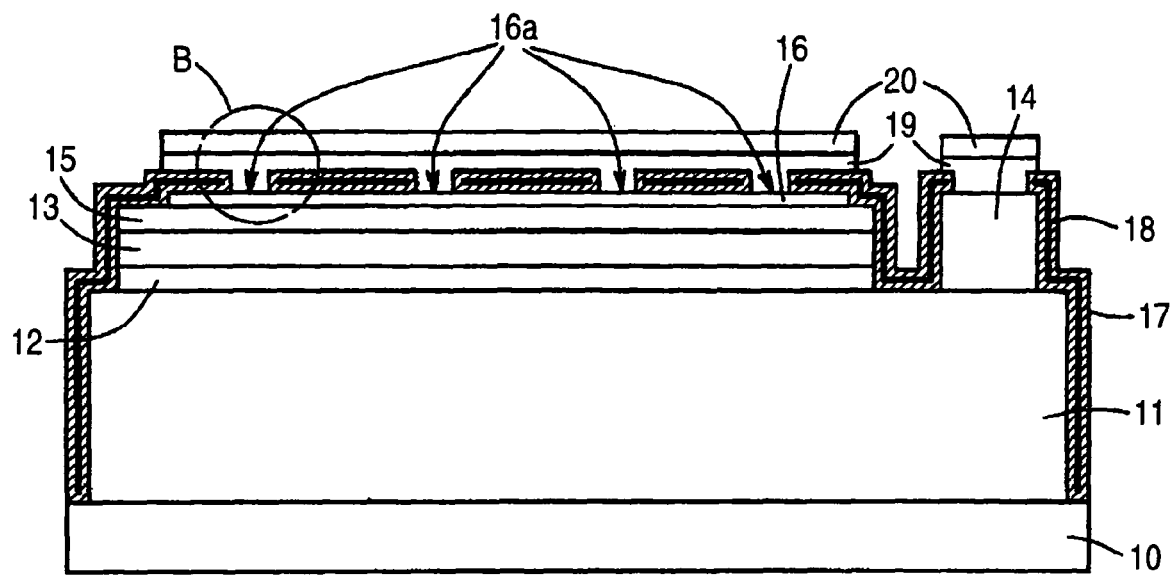
FIG. 2 is a sectional view of the flip chip type light-emitting element of the first embodiment.
Figure 3:
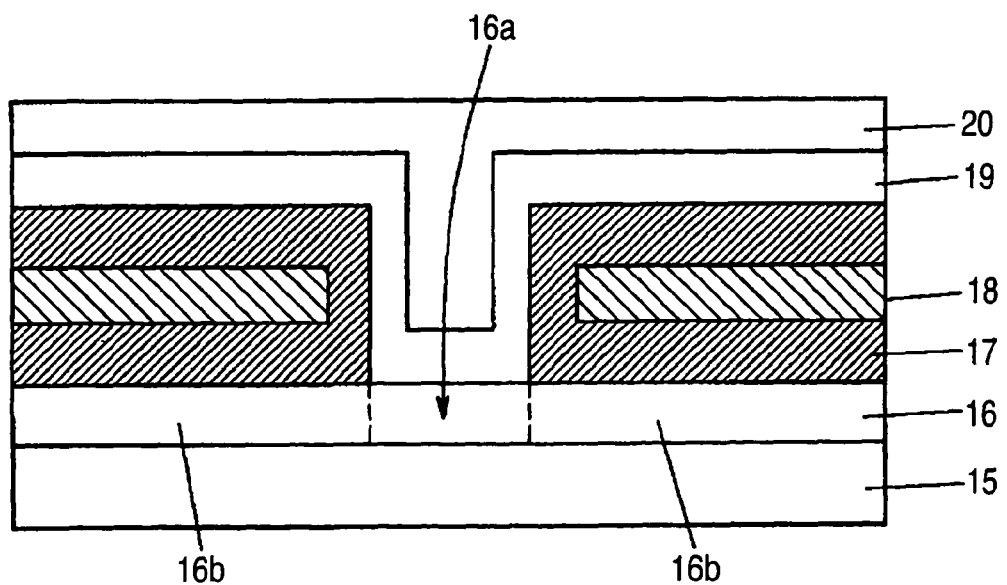
FIG. 3 is an enlarged view of a part B in FIG. 2.

FIG. 1 is a plan view showing the structure of a flip chip type light-emitting element of a first embodiment. FIG. 2 is a sectional view taken along a line A-A' in FIG. 2. FIG. 3 is an enlarged view of a part B in FIG. 2.

The flip chip type light-emitting element mainly includes a III-group nitride semiconductor layer (an n layer 11, an active layer 12, a p layer 13) formed on a sapphire substrate 10 through a buffer layer (not shown in the drawing) and an electrode (an n type contact electrode 14, a light transmission electrode 15, a pad electrode 16) connected thereto.

The III-group nitride semiconductor layer has a structure that the n layer 11, the active layer 12 and the p layer 13 are laminated in order. The n layer has a structure that the n type contact layer composed of GaN doped with Si to a high concentration and an n clad layer composed of GaN are laminated in order. The p layer 13 has a structure that a p clad layer composed of AlGaN doped with Mg and a p contact layer composed of GaN doped with Mg are laminated in order. The active layer has an MQW structure in which a barrier layer composed of GaN and a well layer composed of InGaN are repeatedly laminated.

The active layer 12 and the p layer 13 are partly etched and the n type contact layer of the n layer 11 is exposed in a comb-tooth shape. On the exposed n layer 11, the n type contact electrode 14 is formed.

The light transmission electrode 15 made of an ITO is formed over the entire surface of the upper surface of the p layer 13. On the light transmission electrode 15, 20 pad electrodes 16 arranged on a plane at prescribed intervals are formed. The thickness of the light transmission electrode 15 is 300 nm. The area of the light transmission electrode 15 is about 58% as large as the area of the flip chip type light-emitting element. The pad electrode 16 has three-layer structure of Ni/Au/Al and its thickness includes 40 nm for Ni, 100 nm for Au and 10 nm for Al. Ni is used, because Ni has good contact characteristics with the ITO.

A plane form of the pad electrode 16 has four branches 16b (branch parts of the present invention protruding in the form of a cross from a central circular part 16a (a base part of the present invention). The adjacent pad electrodes 16 are connected to each other by the branches 16b and the pad electrodes 16 are connected together in a comb-teeth shape as a whole along the plane form of the p layer 13. Further, the branches 16b for connecting the pad electrodes 16 together further branch at the central part of the branches 16b to have two branches 16c. The diameter of the central circular part 16a of the pad electrode is 28 μm. The width of the branches 16b and 16c is 5 μm. The area of all the pad electrodes 16 is about 8% as large as the area of the flip chip light-emitting element.

The III-group nitride semiconductor layer (the n layer 11, the active layer 12, the p layer 13) is covered with an insulating protective film 17 made of $SiO_2$ except the surface of the n type contact electrode 14 and the central circular parts 16a of the pad electrodes 16. In the insulating protective film 17, a reflecting film 18 made of Al is formed. The reflecting film 18 serves to increase a reflection factor and improve a light taking out efficiency. As the reflecting film 18, a high reflective metal such as Ag can be used as well as Al.

In the flip chip type light-emitting element, barrier layers 19 as multi-layer films having Ti/Ni repeatedly formed two times are formed on the pad electrodes 16 and the n contact electrode 14. On the barrier layers 19, junction electrodes 20 made of Au—Sn are formed. The flip chip type light-emitting element is connected to a wiring board through the junction electrodes 20.

When the flip chip type light-emitting element of the first embodiment is operated, an electric current is supplied to the pad electrodes 16, the light transmission electrode 15 and the p layer 13 from the junction electrodes 20. When the electric current is supplied from the pad electrodes 16 to the light transmission electrode 15, the electric current is not dispersed to the entire part of a planar direction of the pad electrodes 16 and supplied to the light transmission electrode 15, but is supplied concentrically to side parts 16d as the outer peripheral parts of the pad electrodes 16 and to the light transmission electrode 15 from an outline in an interface of the pad electrodes 16 and the light transmission electrode 15. Here, the pad electrodes 16 have the four branches 16b and the two branches 16c. Accordingly, the side parts 16d as the outer peripheral parts of the pad electrodes 16 are longer than the outer peripheries of circular pad electrodes simply having the same areas due to the protrusions of the branches 16b and 16c. Therefore, the area of the pad electrodes 16 is the same as the area of a case that the usual circular pad electrodes 16 are used, however, the outer peripheries are longer than those of the usual circular pad electrodes. Thus, the electric current supplied to the light transmission electrode 15 can be dispersed and the current density of the side parts 16*d* can be reduced. Namely, the same light intensity as that of a case that the circular pad electrodes are used is maintained and the deterioration of the light transmission electrode 15 can be suppressed at the same time by dispersing the electric current. Further, since the deterioration of the light transmission electrode 15 can be suppressed, the rise of Vf can be suppressed.

Further, the surfaces of the central parts 16*a* of the pad electrodes 16 are not covered with the insulating protective film 17, however, the surfaces of the branches 16*b* and 16*c* of the pad electrodes 16 are covered with the insulating protective films 17. Accordingly, in the flip chip type light-emitting element of the first embodiment, the reflecting film 18 can be provided in the upper parts of the branches 16*b* and 16*c* of the pad electrodes 16. That is, the area of the reflecting film 18 can be made to be wider than that of the case that only the circular pad electrodes are used.

As described above, the flip chip type light-emitting element of the first embodiment is such a flip chip type light-emitting element in which the same light intensity as that of the usual flip chip type light-emitting element having the circular pad electrodes is maintained and the deterioration of the light transmission electrode is suppressed at the same time.

Figure 4:
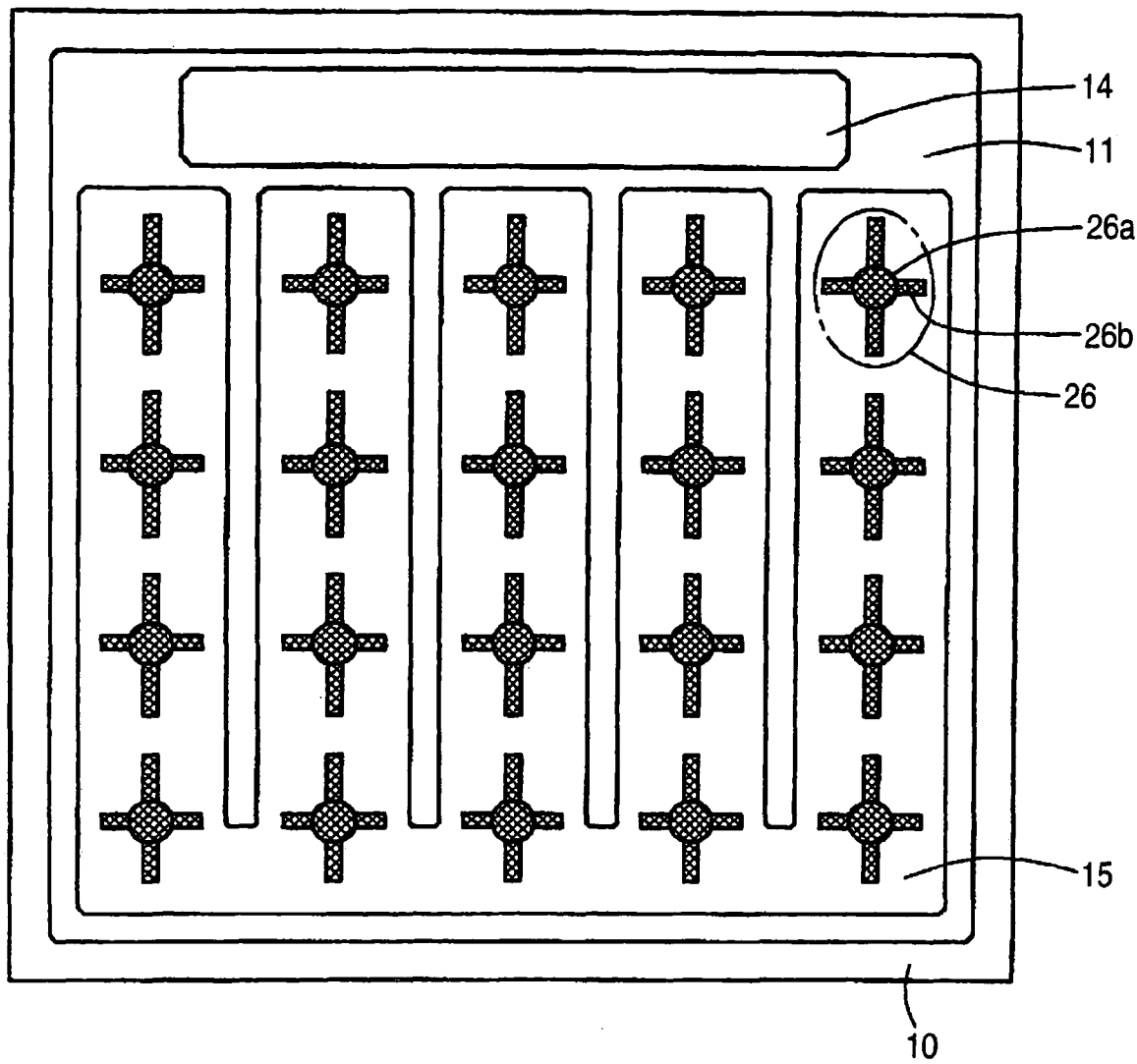
FIG. 4 is a diagram showing the form of another pad electrode of the present invention.
Figure 5:
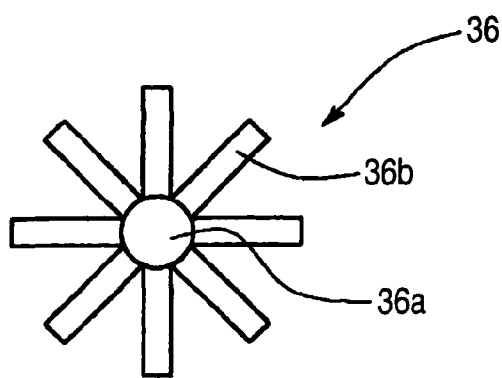
FIG. 5 is a diagram showing the form of other pad electrode of the present invention.
Figure 6:
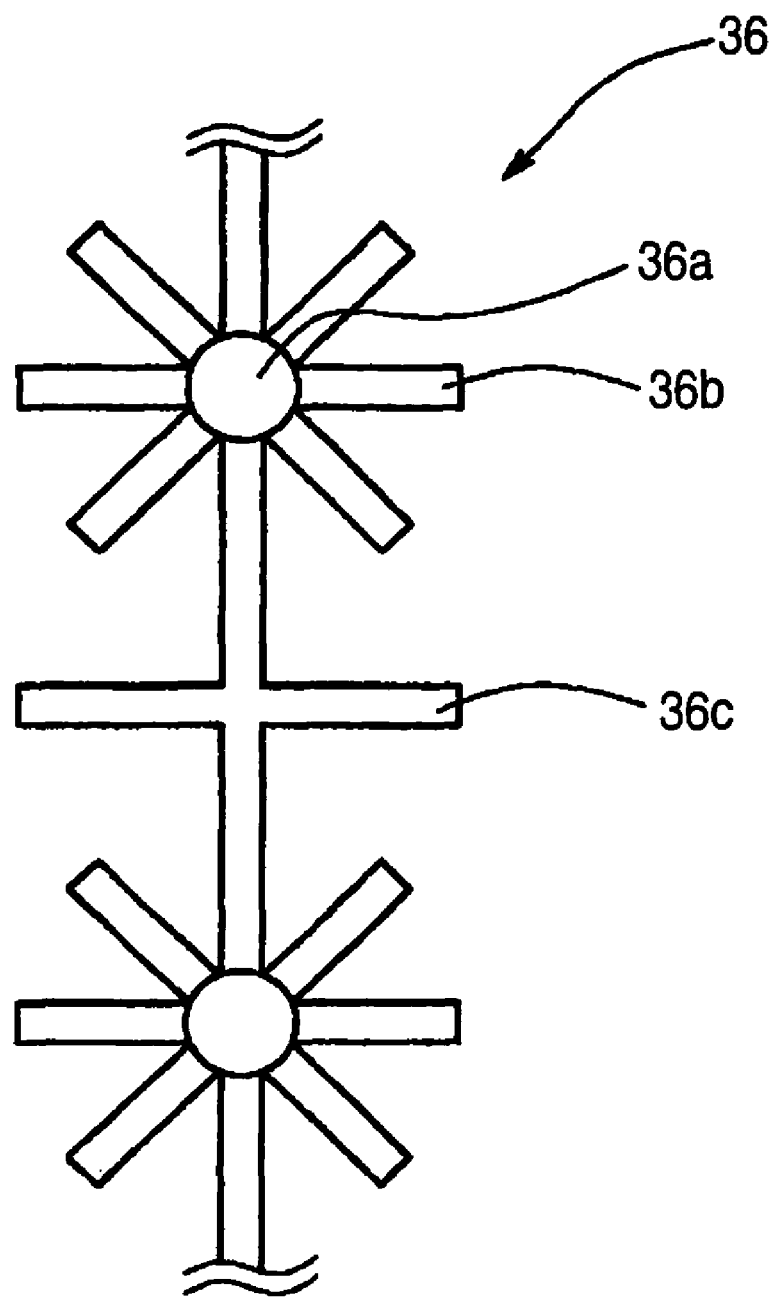
FIG. 6 is a diagram showing the form of other pad electrode of the present invention.

In the above-described embodiment, the plane form of the pad electrode has the branches protruding in the form of a cross from the circular central part. However, the present invention is not limited to such a form and any of forms may be used that have branches configured in a convex-concave shapes continuously from a base part. Further, the pad electrodes are respectively connected to each other by the branches, however, the pad electrodes do not need to be connected together. For instance, as shown in FIG. 4, each pad 26 may have a form that the pad electrode 26 has four branches 26*b* protruding from a central part 26*a*, each pad electrode 26 is independent and the pad electrodes 26 are not connected together by the branches 26*b*. Further, as shown in FIG. 5, a pad electrode 36 may have a form that eight branches 36*b* protrude in radial directions from a central part 36*a* and each pad electrode 36 is independent. Further, as shown in FIG. 6, a pad electrode 36 may have a form that the pad electrodes 36 are connected to each other by branches 36*b* and further have branches 36*c* branching at the center of the connecting branches 36*b*.

Further, in the above-described embodiment, the ITO is used as the light transmission electrode, however, ZnO or the like may be used.

Further, the flip chip type light-emitting element of the above-described embodiment has the sapphire substrate as a growth substrate. However, the growth substrate may be removed by a laser lift off method. In the III-group nitride semiconductor layer exposed by removing the growth substrate, the light taking out efficiency can be improved by a shape having an convex and concave or the like.

The present invention can be used as a lighting device or the like.

What is claimed is:

1. A flip chip type light-emitting element, comprising:
   a III-group nitride semiconductor layer comprising an n layer, a p layer and an active layer formed between the n layer and the p layer, the n layer being exposed in a comb-tooth shape;
   an n type contact electrode provided on the n layer;
   a light transmission electrode provided on the p layer;
   a plurality of pad electrodes provided on the light transmission electrode;
   an insulating protective film that covers a surface of the III-group nitride semiconductor layer except a part of the pad electrodes; and
   a reflecting film provided above the light transmission electrode and in the insulating protective film so as to reflect a light emitted from the active layer to a side of the n layer,
   wherein at least one of the plurality of pad electrodes comprises a base part that is not covered with the insulating protective film, and a plurality of branch parts that is formed from the base part, and
   wherein the base part is connected to a junction electrode provided above the reflecting film.

2. The flip chip type light-emitting element according to claim 1, wherein the branch part is formed in a linear shape protruding from the base part.

3. The flip chip type light-emitting element according to claim 2, wherein the branch part has a branching linear shape relative to the linear shape.

4. The flip chip type light-emitting element according to claim 1, wherein the branch part is formed in a linear shape protruding in the form of a cross from the base part.

5. The flip chip type light-emitting element according to claim 1, wherein the branch part is extended in the lower part of the reflecting film.

6. The flip chip type light-emitting element according to claim 1, wherein the light transmission electrode comprises Indium Tin Oxide (ITO).

7. The flip chip type light emitting element according to claim 1, further comprising a barrier layer located above the base part and the insulating protective film,
   wherein the junction electrode is located above the barrier layer.

8. The flip chip type light emitting element according to claim 1, wherein the branch part comprises a first branch that extends from the base part, and a second branch that extends from the first branch.

9. The flip chip type light emitting element according to claim 8, wherein the second branch extends perpendicularly from the first branch.

10. The flip chip type light emitting element according to claim 1, wherein the plurality of pad electrodes are connected to each other via the branch part.

11. The flip chip type light emitting element according to claim 1, wherein the base part has a diameter of about 28 μm.

12. The flip chip type light emitting element according to claim 1, wherein the branch part has a width of about 5 μm.

13. The flip chip type light emitting element according to claim 1, wherein the reflecting film is encapsulated within the insulating protective film.

14. A light-emitting element, comprising:
   a semiconductor layer comprising an n layer, a p layer, and an active layer located between the n layer and the p layer;
   an n type contact electrode on the n layer;
   a light transmission electrode provided on the p layer;
   a plurality of pad electrodes provided on the light transmission electrode;
   an insulating protective film that covers the semiconductor layer except a part of the pad electrodes; and
   a reflecting film encapsulated within the insulating protective film,
   wherein at least one of the plurality of pad electrodes comprises a base part that is not covered with the insulating protective film, and a plurality of branch parts that is formed from the base part, and wherein the base part is connected to a junction electrode provided above the reflecting film.

15. The light emitting element according to claim 14, further comprising a barrier layer located above the base part and the insulating protective film, wherein the junction electrode is located above the barrier layer.

16. The light emitting element according to claim 14, wherein the branch part comprises a first branch that extends from the base part, and a second branch that extends from the first branch.

17. The flip chip type light emitting element according to claim 16, wherein the second branch extends perpendicularly from the first branch.

18. The flip chip type light emitting element according to claim 14, wherein the plurality of pad electrodes are connected to each other via the branch part.

19. The flip chip type light emitting element according to claim 14, wherein the base part has a diameter of about 28 μm.

20. The flip chip type light emitting element according to claim 14, wherein the branch part has a width of about 5 μm.

* * * * *